(12) United States Patent
Park

(10) Patent No.: US 8,093,726 B2
(45) Date of Patent: Jan. 10, 2012

(54) SEMICONDUCTOR PACKAGES HAVING INTERPOSERS, ELECTRONIC PRODUCTS EMPLOYING THE SAME, AND METHODS OF MANUFACTURING THE SAME

(75) Inventor: Sung-Yong Park, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 590 days.

(21) Appl. No.: 12/286,656

(22) Filed: Oct. 1, 2008

(65) Prior Publication Data

US 2009/0085225 A1   Apr. 2, 2009

(30) Foreign Application Priority Data

Oct. 2, 2007 (KR) .................. 10-2007-0099422

(51) Int. Cl.
*H01L 23/48* (2006.01)
(52) U.S. Cl. .. 257/777; 257/686; 257/730; 257/E25.013
(58) Field of Classification Search .................. 257/686, 257/E25.013, 777, 778, E23.169, 730
See application file for complete search history.

(56) References Cited

U.S. PATENT DOCUMENTS

| 6,005,778 | A | * | 12/1999 | Spielberger et al. | .......... 361/770 |
| 6,740,970 | B2 | * | 5/2004 | Hiraoka et al. | ................ 257/723 |
| 6,919,631 | B1 | * | 7/2005 | Hoffman et al. | .............. 257/707 |
| 7,829,991 | B2 | * | 11/2010 | Moden et al. | .................. 257/686 |
| 7,872,340 | B2 | * | 1/2011 | Choi et al. | ..................... 257/686 |
| 2007/0018339 | A1 | | 1/2007 | Takinomi | |

FOREIGN PATENT DOCUMENTS

| JP | 2002-373968 | 12/2002 |
| JP | 2007-27579 | 2/2007 |
| KR | 2000-0040218 | 7/2000 |
| KR | 2001-0062929 | 7/2001 |
| KR | 10-2007-0011037 | 1/2007 |
| KR | 10-2007-0013480 | 1/2007 |

* cited by examiner

Primary Examiner — Kenneth Parker
Assistant Examiner — Jose R Diaz
(74) Attorney, Agent, or Firm — Onello & Mello, LLP

(57) ABSTRACT

A semiconductor package and methods for manufacturing the same are provided. The semiconductor package includes a substrate, first and second semiconductor chips stacked on the substrate. An interposer is disposed between the first and second semiconductor chips. The interposer has a non-planar top surface.

15 Claims, 12 Drawing Sheets

SEMICONDUCTOR PACKAGES HAVING INTERPOSERS, ELECTRONIC PRODUCTS EMPLOYING THE SAME, AND METHODS OF MANUFACTURING THE SAME

CROSS-REFERENCE TO RELATED APPLICATIONS

This U.S. non-provisional patent application claims priority under 35 U.S.C. §119 of Korean Patent Application No. 10-2007-0099422 filed on Oct. 2, 2007, the entire contents of which are hereby incorporated by reference.

FIELD OF THE INVENTION

The invention relates to semiconductor packages, and more particularly, to semiconductor multi-chip packages having interposers, electronic products employing the same and methods for manufacturing the same.

BACKGROUND

The development of electronic devices and demands of users require advances in packaging to enable more integrated and compact devices. An example of semiconductor packages intended to meet these requirements may be multi-chip packages (MCPs), which include a plurality of semiconductor chips stacked on a lead frame or printed circuit board.

In general, two packaging techniques have been widely used to accommodate two or more semiconductor chips in a semiconductor package such as the MCP. For example, the MCP may include a plurality of semiconductor chips that are vertically stacked or horizontally arrayed. The vertical stacking technique is mainly used to manufacture compact and light semiconductor packages. In this case, interposers may be disposed between the semiconductor chips that are vertically stacked. One example of the MCP is taught in Korean Patent Publication No. 10-2000-0040218. Another example of the MCP is in Korean Patent Publication No. 10-2001-0062929.

SUMMARY OF THE INVENTION

Aspects of the present invention relate to semiconductor packages having interposers, electronic products employing the same, and methods of manufacturing the same.

In accordance with one aspect of the invention, provided is a semiconductor package that comprises a substrate, first and second semiconductor chips stacked on the substrate, and a first interposer between the first and second semiconductor chips. The first interposer has a first non-planar top surface.

The first non-planar top surface may comprise a stepped region defining a first region and a second region, and the second region may be thinner than the first region to define a recessed region on the second region.

The second semiconductor chip may be stacked on the second region.

The first interposer may comprise a circuit pattern disposed in one of the first and second regions.

The first interposer can have a rectangular shape including four corners, and the second region may be disposed to include only one corner of the first interposer and the first region may be disposed to include three corners of the first interposer.

Alternatively, the second region may be disposed at a central part of the first interposer and the first region may surround the second region.

The first region may include two separated regions and the second region may be disposed between the two separated regions.

The second region may be disposed only at one side of the first region.

In addition, the second semiconductor chip vertically protrudes from a top surface of the first region.

The second semiconductor chip may laterally extend to have an overhang over the first semiconductor chip.

The semiconductor package may further comprise a gap between the first semiconductor chip and the overhang of the second semiconductor chip. The gap may have a vertical width which is equal to a thickness of the second region of the first interposer.

The semiconductor package may further comprise a bonding wire electrically connecting the substrate to the first semiconductor chip. The bonding wire is disposed in the gap.

The first semiconductor chip may be electrically and directly connected to the substrate. The first interposer may be electrically and directly connected to the substrate, and the second semiconductor may be electrically connected to the substrate through the first interposer. The second semiconductor chip may be electrically and directly connected to the substrate. The second semiconductor chip may be electrically connected to the substrate through the first interposer.

The second semiconductor chip may also electrically and directly connect to the substrate.

The second semiconductor chip may be electrically connected to the substrate through one of a bonding wire, a "through silicon via" (TSV), a solder ball, and a solder bump.

At least one of the first and second semiconductor chips may comprise one of a memory device and a logic device.

The semiconductor package may further comprise a third semiconductor chip stacked on the second semiconductor chip, and a second interposer disposed between the second semiconductor chip and the third semiconductor chip. The second interposer may electrically connect the third semiconductor chip to the substrate. In addition, the second interposer may have a second non-planar top surface.

In accordance with another aspect of the invention, provided is a semiconductor package that comprises a first semiconductor package and a second semiconductor package. The first semiconductor package includes a first semiconductor chip, a second semiconductor chip, and a first interposer between the first and second semiconductor chips. The first interposer has a first non-planar top surface. The second semiconductor package is stacked on the first semiconductor package. The second semiconductor package includes a third semiconductor chip, a fourth semiconductor chip, and a second interposer between the third and fourth semiconductor chips. The second interposer has a second non-planar top surface.

In accordance with still another aspect of the invention, provided is a method of manufacturing a semiconductor package that comprises providing a substrate and mounting a first semiconductor chip on the substrate to electrically connect the first semiconductor chip to the substrate. A first interposer is mounted on the first semiconductor chip to electrically connect the first interposer to the substrate. The first interposer is formed to include a first region and a second region which is lower than the first region. A second semiconductor chip is mounted on the second region of the first interposer to electrically connect the second semiconductor chip to the first interposer.

Mounting the second semiconductor chip may comprise electrically connecting the second semiconductor chip to the substrate through the first interposer.

In addition, mounting the second semiconductor chip may further comprise electrically and directly connecting the second semiconductor chip to the substrate.

The method of manufacturing the semiconductor package may further comprise mounting a second interposer on the second semiconductor chip to electrically connect the second interposer to the substrate. The second interposer comprises a first region and a second region which is lower than the first region. And the method comprises mounting a third semiconductor chip on the second interposer to electrically connect the third semiconductor chip to the second interposer. The third semiconductor chip is stacked on the second region of the second interposer.

The semiconductor packages described above can be used in any of a number of electronic products.

BRIEF DESCRIPTION OF THE DRAWINGS

Aspects of the present invention will become more apparent in view of the accompanying drawings and detailed description. The embodiments depicted therein are provided by way of example, not by way of limitation. The drawings are not necessarily to scale, emphasis instead being placed upon illustrating aspects of the invention. In the drawings.

DETAILED DESCRIPTION OF PREFERRED EMBODIMENTS

Figure 1A:
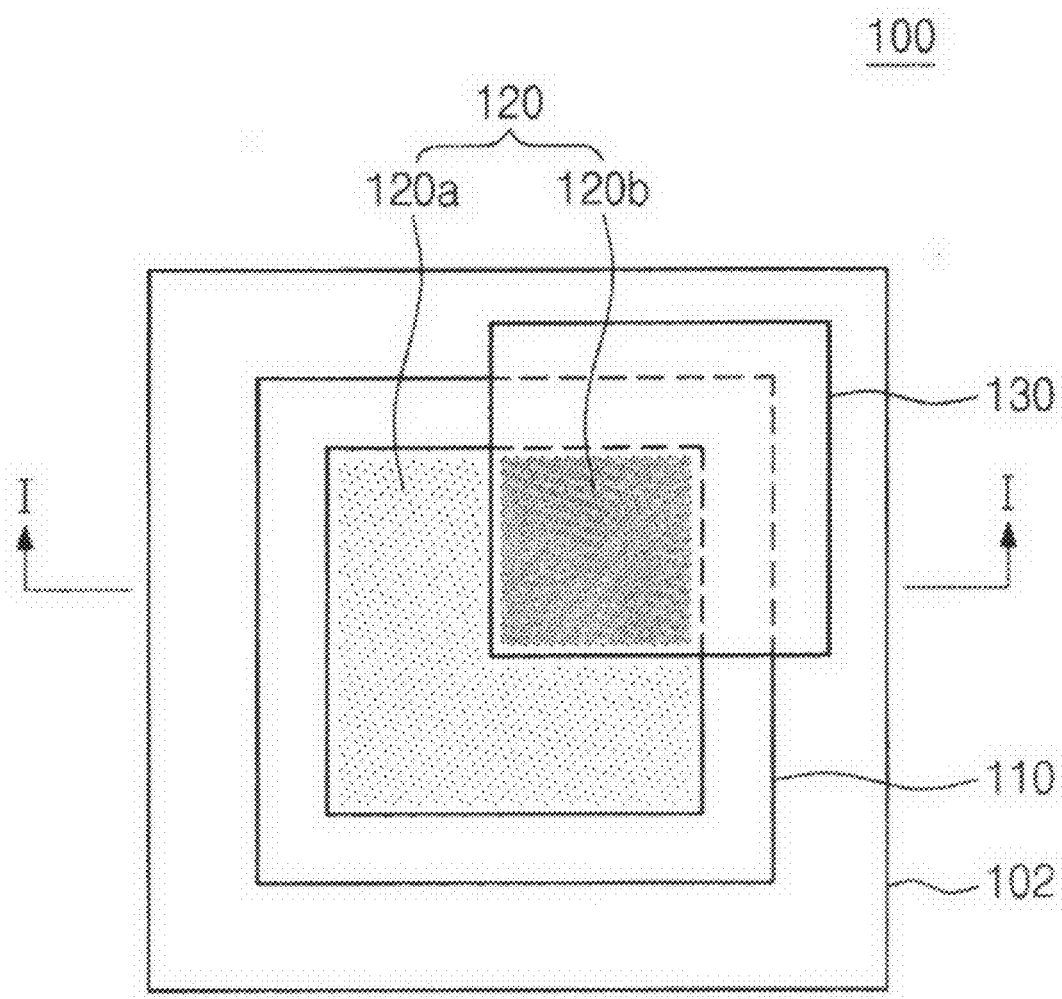
FIG. 1A is a plan view illustrating a first exemplary embodiment of a semiconductor package according to aspects of the present invention.

Preferred embodiments in accordance with the present invention will be described below in more detail with reference to the accompanying drawings. The present invention may, however, be embodied in different forms and should not be constructed as limited to the embodiments set fourth herein. Like numerals refer to like elements throughout the specification.

It will be understood that, although the terms first, second, etc. are be used herein to describe various elements, these elements should not be limited by these terms. These terms are used to distinguish one element from another, but not to imply a required sequence of elements. For example, a first element can be termed a second element, and, similarly, a second element can be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements, and/or components, but do not preclude the presence or addition of one or more other features, steps, operations, elements, components, and/or groups thereof.

Spatially relative terms, such as "beneath," "below," "lower," "above," "upper" and the like may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as "below" and/or "beneath" other elements or features would then be oriented "above" the other elements or features. The device may be otherwise oriented (e.g., rotated 90 degrees or at other orientations) and the spatially relative descriptors used herein interpreted accordingly.

Hereinafter, exemplary embodiments in accordance with aspects of the present invention will be described in conjunction with the accompanying drawings.

Figure 1B:
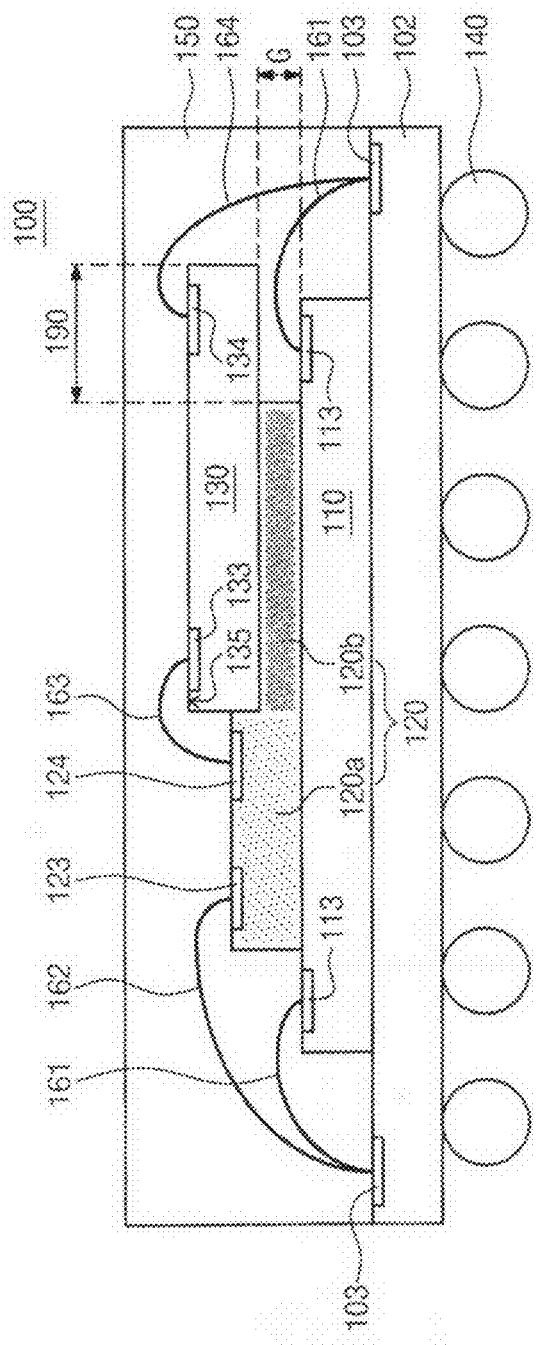
FIG. 1B is a sectional view taken along the line I-I of FIG. 1A.
Figure 1C:
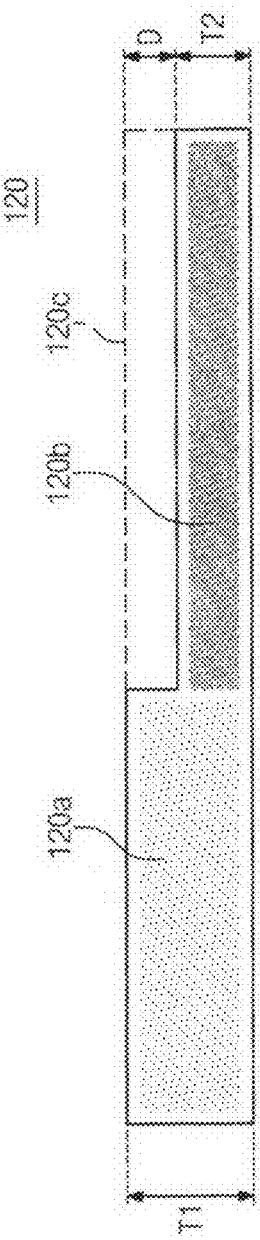
FIG. 1C is a sectional view illustrating a portion of FIG. 1B.

Referring to FIGS. 1A through 1C, a first exemplary embodiment of a semiconductor package 100 according to aspects of the present invention may comprise a first semiconductor chip 110 stacked on a circuit substrate 102. The circuit substrate 102 may include a printed circuit board. The first semiconductor chip 110 may include a memory device or a logic device. The memory device may be a DRAM device or a flash memory device. An interposer 120 having a non-planar top surface is stacked on the first semiconductor chip 110. The interposer 120 may be a substrate having a circuit pattern to electrically connect the circuit substrate 102 to a second semiconductor chip 130 to be disposed on the interposer 120. Further, the interposer 120 may include at least one recessed region in the upper portion thereof. In this case, the non-planar top surface of the interposer 120 may have a stepped profile due to the recessed region 120c, as illustrated in FIG. 1C. As a result, the interposer 120 may include a first region 120a having a first thickness T1 and a second region 120b having a second thickness T2 that is less than the first thickness T1. Hence, the recessed region 120c may have a depth (or a step height) D which corresponds to a difference between the first thickness T1 and the second thickness T2. The interposer 120 may have a rectangular shape when viewed from a top plan view, as illustrated in FIG. 1A. That is, the interposer 120 may have four corners. In this case, the second region 120b under the recessed region 120c may be disposed to include only one corner and the first region 120a may be disposed to include three corners, as depicted in FIG. 1A.

In one embodiment, the first region 120a has electrical circuit patterns therein and the second region 120b does not have any electrical circuit patterns. Thus, the first region 120a may be referred to as "a pattern region" and the second region 120b may be referred to as "a non-pattern region". However, the present invention is not limited to this configuration of patterns.

The second semiconductor chip 130 may be stacked on a bottom surface of the recessed region 120c formed in the interposer 120, as shown in FIG. 1B. That is, the second semiconductor chip 130 may be disposed on the non-pattern region 120b. The second semiconductor chip 130 may include a memory device or a logic device, and the memory device may be a DRAM device or a flash memory device, as examples. The semiconductor package 100 may comprise electrical members 161 through 164, such as bonding wires, which electrically connect the semiconductor chips 110 and 130 to the circuit substrate 102.

In another embodiment, the first semiconductor chip 110 may be electrically connected to the circuit substrate 102 via first bonding wires 161. In more detail, the first bonding wires 161 may electrically connect substrate pads 103 of the circuit substrate 102 to chip pads 113 of the first semiconductor chip 110. The chip pads 113 may comprise edge pads or redistributed pads.

The second semiconductor chip 130 may be electrically connected to the circuit substrate 102 via the interposer 120. For example, the interposer 120 may be electrically connected to the circuit substrate 102 via a second bonding wire 162, and second semiconductor chip 130 may be electrically connected to the interposer 120 via a third bonding wire 163. Consequently, the second semiconductor chip 130 may be electrically connected to the circuit substrate 102 through the interposer 120, the second bonding wire 162 and the third bonding wire 163. Further, the second semiconductor chip 130 may be electrically and directly connected to the circuit substrate 102 via a fourth bonding wire 164. When the second semiconductor 130 is electrically connected to the circuit substrate 102 via the interposer 120, the length of the third bonding wire 163 can be reduced since there is no need to extend the third bonding wire 163 onto the circuit substrate 102. In addition, if the second semiconductor 130 is electrically connected to the circuit substrate 102 via the interposer 120, the third bonding wire 163 can avoid being in contact with the first bonding wire 161. Thus, there may be no limitation in arraying the chip pads 113, 133 and 134.

The interposer 120 may comprise a pad 123 electrically connected to the second bonding wire 162 and a pad 124 electrically connected to the third bonding wire 163. The pads 123 and 124 may be disposed in the pattern region 120a having the electrical circuits. The second semiconductor chip 130 may comprise a chip pad 133 electrically connected to the third bonding wire 163 and a chip pad 134 electrically connected to the fourth bonding wire 164. The chip pads 133 and 134 may be edge pads or redistributed pads.

A plurality of external terminals 140, such as solder balls, may be disposed on a backside surface of the circuit substrate 102. The semiconductor package 100 may be a multi-chip package, for instance. The semiconductor package 100 may further comprise a molding member 150, such as an epoxy molding compound, that isolates and protects the first and second semiconductor chips 110 and 130 from the external environment. That is, the molding member 150 encapsulates the first and the second semiconductor chips 110 and 130, in this embodiment.

As illustrated in FIG. 1C, the non-pattern region 120b may be formed by removing a portion of the interposer 120 using an etching process. Thus, when the second semiconductor chip 130 is stacked on the non-pattern region 120b as described above, a total thickness of the semiconductor package 100 may be reduced by the step height D.

As illustrated in FIG. 1B, a gap having a vertical space G may be provided between the first semiconductor chip 110 and an overhang 190 of the second semiconductor chip 130. The gap space G may be equal to the second thickness T2. Thus, the gap may provide a spatial area which is sufficient to form the first bonding wire 161 under the overhang of the second semiconductor chip 130. That is, a bonding margin for the first bonding wires 161 may be increased as a result.

The second semiconductor chip 130 may have at least one end portion laterally protruding from an end portion of the interposer 120. That is, the second semiconductor chip 130 may be partially superimposed on the non-pattern region 120b of the interposer 120, thereby creating an overhang 190, which does not overlap the interposer 120. If the second semiconductor chip 130 includes the overhang 190, the second semiconductor chip 130 should have a sufficient thickness to prevent the second semiconductor chip 130 from being broken or cracked due to the overhang 190. In addition, when the thickness of the second semiconductor chip 130 is increased without the recessed region 120c, the step height between the interposer 120 and the second semiconductor chip 130 may be equal to the thickness of the second semiconductor chip 130. In this case, the length of the third bonding wire 163 should be increased in order to prevent the third bonding wire 163 from contacting an edge 135 of the second semiconductor chip 130. However, according to one embodiment, the second semiconductor chip 130 may be disposed on the non-pattern region 120b having the second thickness T2, as illustrated in FIG. 1B. Thus, the step height between the interposer 120 and the second semiconductor chip 130 may be reduced by the depth D of the recessed region 120c.

That is, even though the thickness of the second semiconductor chip 130 is increased, the step height between the interposer 120 and the second semiconductor chip 130 may be minimized due to the presence of the recessed region 120c. There may be, therefore, no possibility of an electrical shortage between the third bonding wire 163 and the edge 135 even without extension of the third bonding wire 163.

In some embodiments, electrical connections amongst the semiconductor chips 110 and 130, the interposer 120, and the circuit substrate 102 may be accomplished using solder balls, solder bumps, etc., instead of the bonding wires. Alternatively, the non-pattern region 120b may comprise a circuit pattern. In this case, the interposer 120 may be electrically connected to the second semiconductor chip 130 by "through silicon vias" (TSVs), solder balls, solder bumps, etc.

The second semiconductor chip 130 may have a top surface that is higher than that of the interposer 120 (for example, the top surface of the pattern region 120a). That is, an upper portion of the second semiconductor chip 130 may upwardly protrude from the top surface of the pattern region 120a, as illustrated in FIG. 1B. Alternatively, the second semiconductor chip 130 may not have any vertical protrusions from the interposer 120. For example, the second semiconductor chip 130 may have a top surface which is coplanar with that of the interposer 120 (for example, the top surface of the pattern region 120a).

The second semiconductor chip 130 may have a planar area which is greater than that of the interposer 120, as illustrated in FIG. 1A. In this case, the second semiconductor chip 130 may have the overhang 190 as depicted in FIG. 1B. Alternatively, the planar area of the second semiconductor chip 130 may be equal to or less than that of the interposer 120. The semiconductor package 100 may have a "ball grid array" (BGA) structure. The interposer 120 may take various configurations as described hereinafter.

Figure 2A:
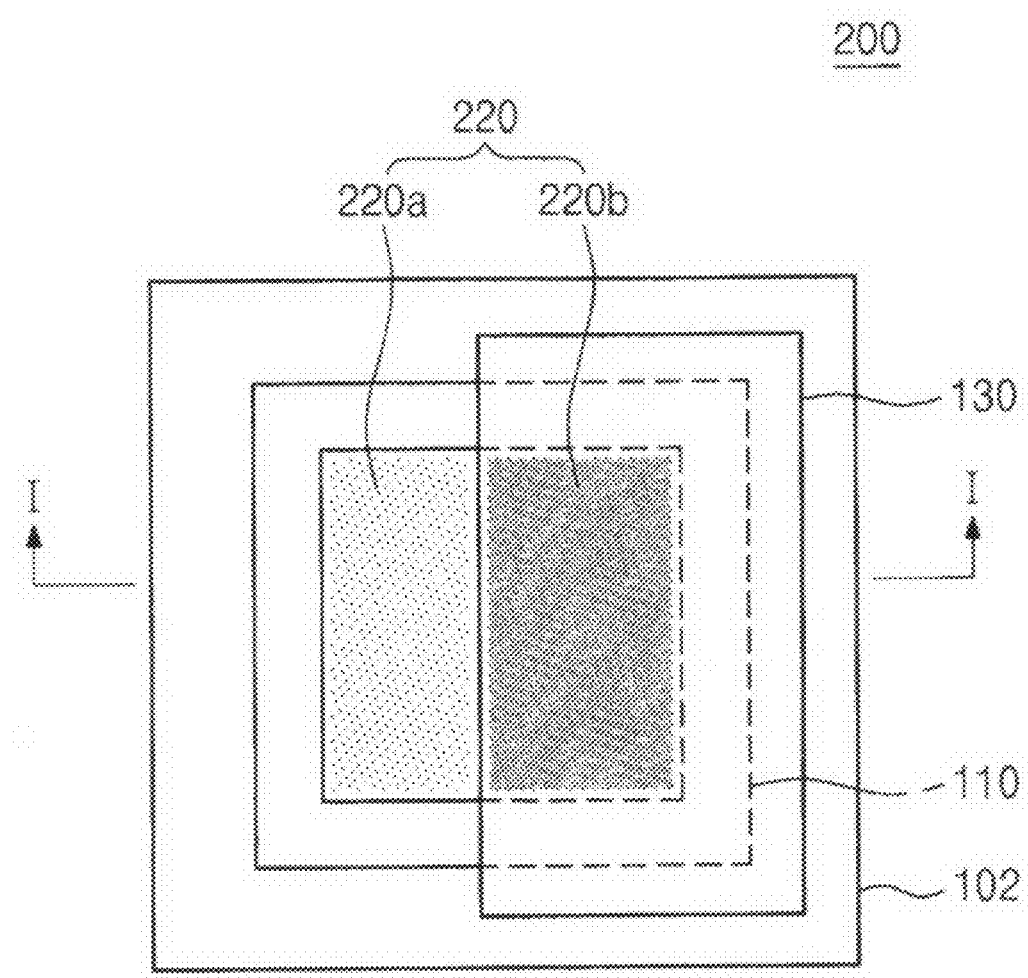
FIG. 2A is a plan view illustrating a second exemplary embodiment of a semiconductor package according to aspects of the present invention.
Figure 2B:
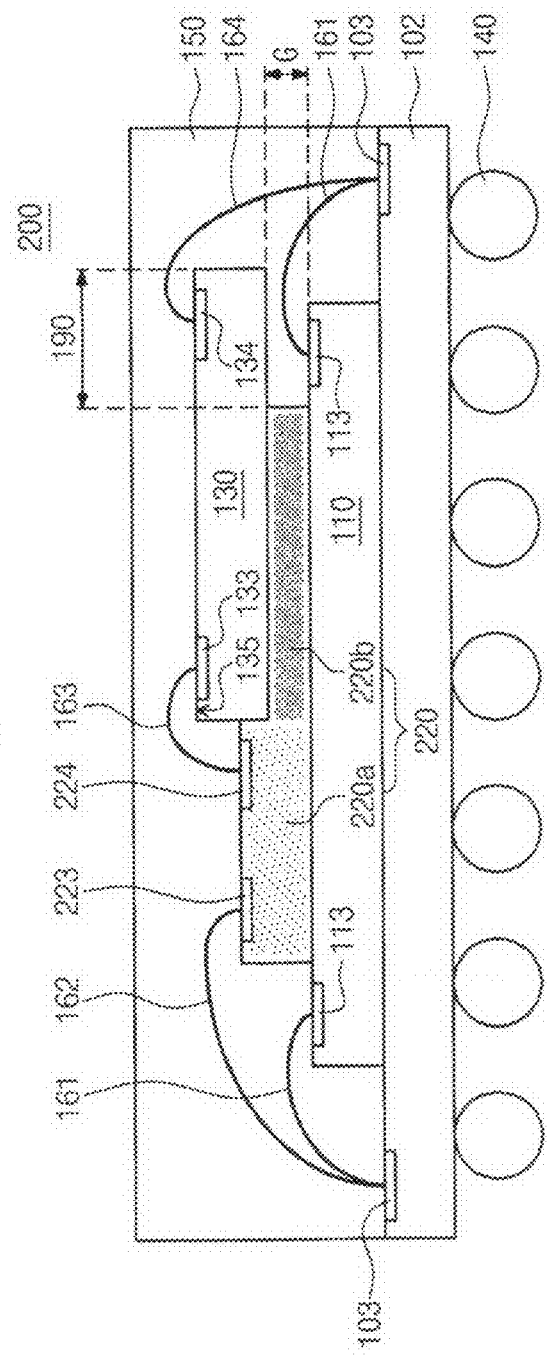
FIG. 2B is a sectional view taken along the line I-I of FIG. 2A.
Figure 2C:
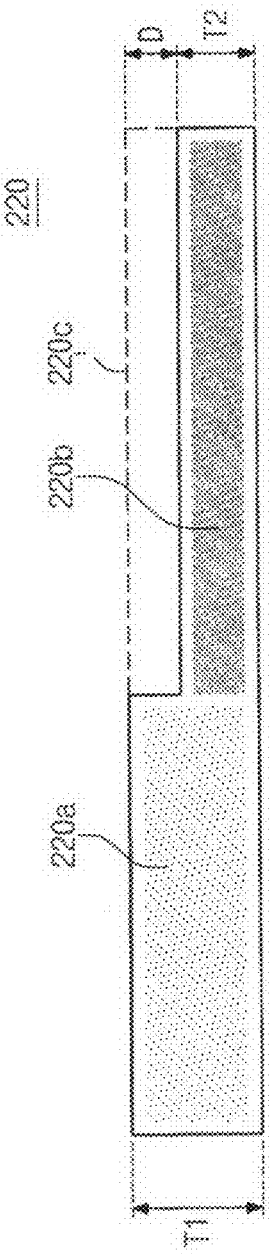
FIG. 2C is a sectional view illustrating a portion of FIG. 2B.

FIG. 2A is a plan view illustrating a second embodiment of a semiconductor package 200 according to aspects of the present invention, FIG. 2B is a cross sectional view taken along the line I-I of FIG. 2A, and FIG. 2C is a cross sectional view illustrating a portion of FIG. 2B. The present embodiment is different from the first embodiment described with reference to FIGS. 1A to 1C in terms of a configuration of a recessed region in which the second semiconductor chip is located. Thus, only the descriptions regarding the recessed region will be provided in detail hereinafter, and the descriptions regarding the same components as the first embodiment will be omitted or briefly mentioned.

Referring to FIGS. 2A through 2C, the semiconductor package 200 according to the second example embodiment may comprise an interposer 220. The interposer 220 may be configured to have at least one recessed region 220c in the upper portion thereof. Thus, the interposer 220 may also have a non-planar top surface, as illustrated in FIGS. 2B and 2C. That is, the top surface of the interposer 220 may have a stepped profile due to the recessed region 220c. As a result, the interposer 220 may include a first region 220a having a first thickness T1 and a second region 220b having a second thickness T2 which is less than the first thickness T1. The second region 220b may be defined below the recessed region 220c. The recessed region 220c may have a depth (or a step height) D which corresponds to a difference between the first thickness T1 and the second thickness T2. In one embodiment, the first region 220a has electrical circuit patterns therein and the second region 220b does not have any electrical circuit patterns. Thus, the first region 220a may be referred to as "a pattern region" and the second region 220b may be referred to as "a non-pattern region".

In the present embodiment, the interposer 220 may also have a rectangular shape including four corners, as illustrated in FIG. 2A. In this case, the non-pattern region 220b may be disposed to include two adjacent corners of the interposer 220 and one sidewall therebetween. Therefore, the pattern region 220a may be disposed to be adjacent to only one side of the non-pattern region 220b, as shown in FIG. 2A.

The second semiconductor chip 130 may be stacked on the non-pattern region 220b, and the interposer 220 may have pads 223 and 224 in the pattern region 220a. One end of the third bonding wire 163 may be in contact with the pad 224 adjacent to the second semiconductor chip 130 and the other end of the third bonding wire 163 may be in contact with the chip pad 133. Further, one end of the second bonding wire 162 may be in contact with the pad 223 adjacent to an edge of the interposer 220, and the other end of the second bonding wire 162 may be in contact with the substrate pad 103. Thus, the second semiconductor chip 130 may be electrically connected to the circuit substrate 102 via the interposer 220. Alternatively, the second semiconductor chip 130 may be directly connected to the circuit substrate 102 via the fourth bonding wire 164. In other embodiments, the second semiconductor chip 130 may be electrically connected to the circuit substrate 102 via the second, third and fourth bonding wires 162, 163 and 164, respectively.

Figure 3A:
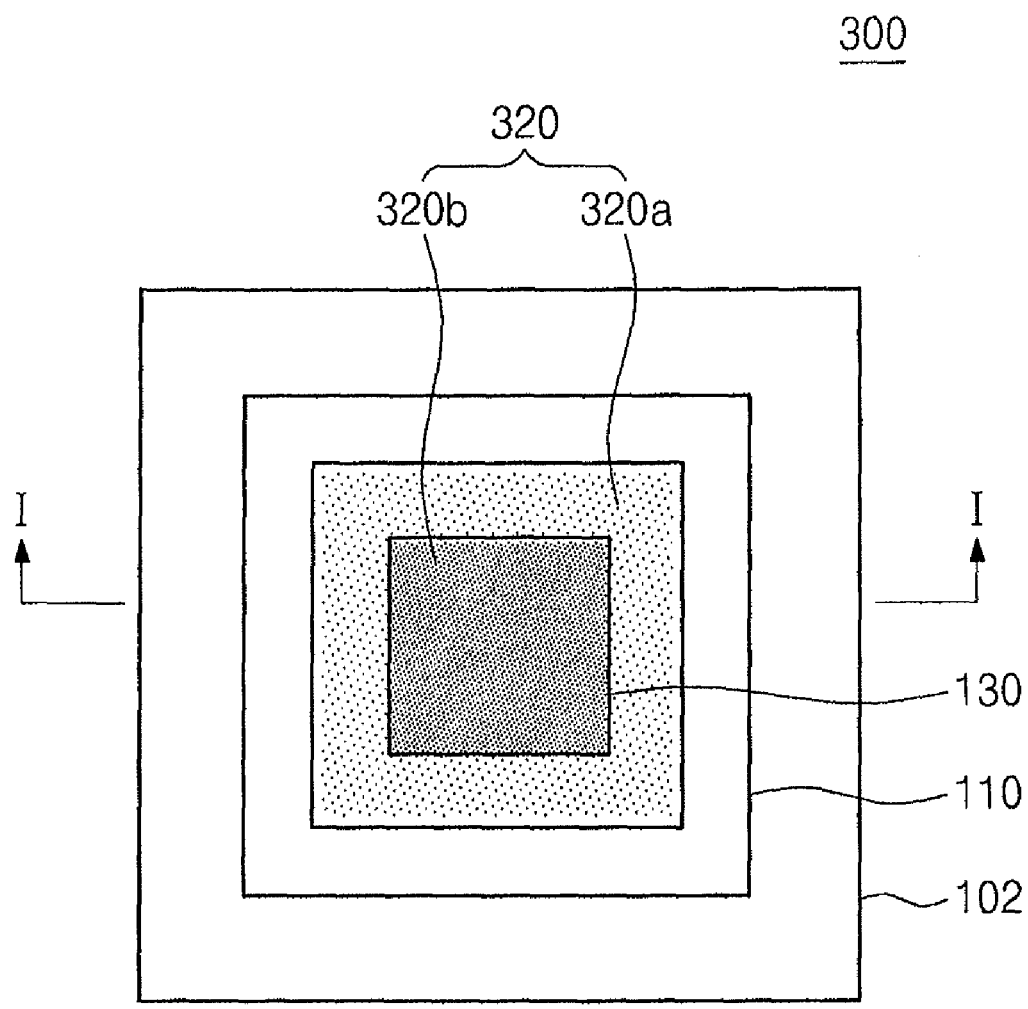
FIG. 3A is a plan view illustrating a third exemplary embodiment of a semiconductor package according to aspects of the present invention.
Figure 3B:
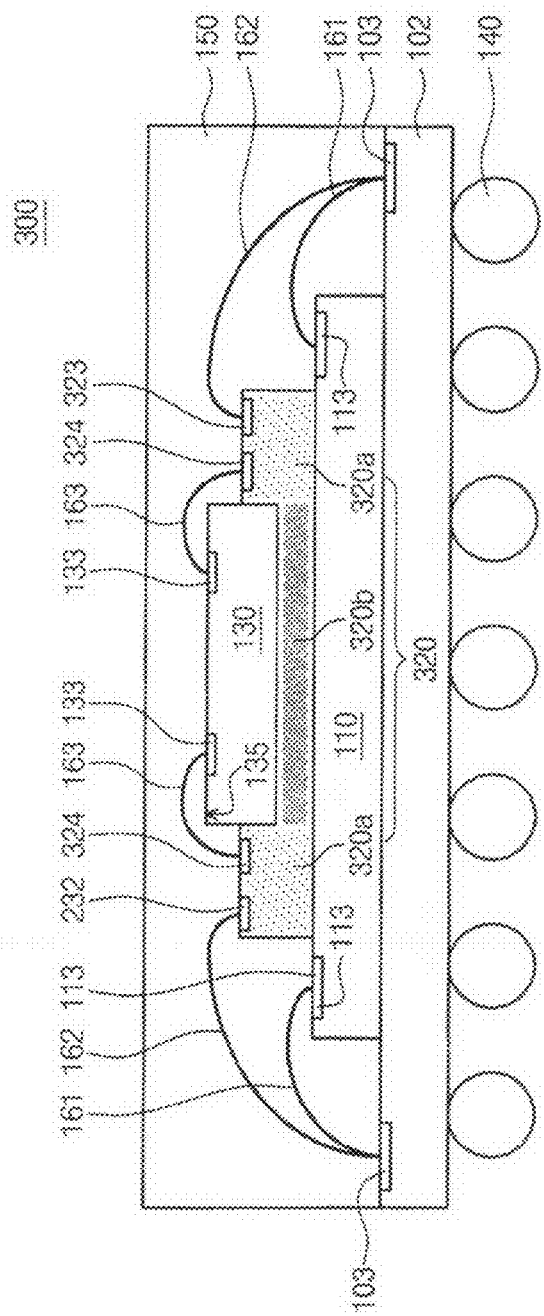
FIG. 3B is a sectional view taken along the line I-I of FIG. 3A.
Figure 3C:
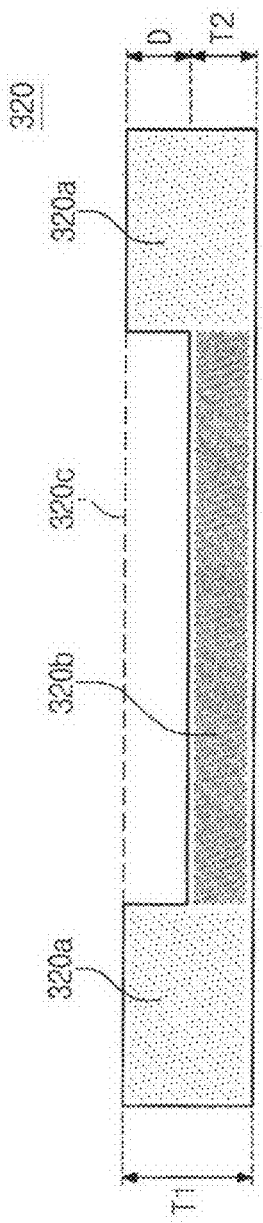
FIG. 3C is a sectional view illustrating a portion of FIG. 3B.

FIG. 3A is a plan view illustrating a third embodiment of a semiconductor package 300 according to aspects of the present invention, FIG. 3B is a cross sectional view taken along the line I-I of FIG. 3A, and FIG. 3C is a cross sectional view illustrating a portion of FIG. 3B. The present embodiment is also different from the first embodiment described with reference to FIGS. 1A to 1C in terms of a configuration of a recessed region in which the second semiconductor chip is located. Thus, only the descriptions regarding the recessed region will be provided in detail hereinafter, and the descriptions regarding the same components as the first embodiment will be omitted or briefly mentioned.

Referring to FIGS. 3A through 3C, the semiconductor package 300 according to the third example embodiment may comprise an interposer 320. The interposer 320 may be configured to have at least one recessed region 320c in the upper portion thereof. Thus, the interposer 320 may also have a non-planar top surface, as illustrated in FIGS. 3B and 3C. That is, the top surface of the interposer 320 may have a stepped profile due to the recessed region 320c. As a result, the interposer 320 may include a first region 320a having a first thickness T1 and a second region 320b having a second thickness T2 that is less than the first thickness T1. The second region 320b may be defined below the recessed region 320c. The recessed region 320c may have a depth (or a step height) D which corresponds to a difference between the first thickness T1 and the second thickness T2. In one embodiment, the first region 320a has electrical circuit patterns therein and the second region 320b does not have any electrical circuit patterns. Thus, the first region 320a may be referred to as "a pattern region" and the second region 320b may be referred to as "a non-pattern region".

In the present embodiment, the non-pattern region 320b beneath the recessed region 320c may be surrounded by the pattern region 320a, as illustrated in FIGS. 3A to 3C. That is, the non-pattern region 320b may be disposed to be spaced apart from the outer sidewalls of the disposer 320.

The second semiconductor chip 130 may be stacked on the bottom surface of the recessed region 320c (i.e., on the top surface of the non-pattern region 320b), and the interposer 320 may have pads 323 and 324 in the pattern region 320a. In one embodiment, the second semiconductor chip 130 does not extend onto the top surface of the pattern region 320a, as illustrated in FIG. 3B. One end of the third bonding wire 163 may be in contact with the pad 324 adjacent to the second semiconductor chip 130 and the other end of the third bonding wire 163 may be in contact with the chip pad 133. Further, one end of the second bonding wire 162 may be in contact with the pad 323 adjacent to an edge of the interposer 320, and the other end of the second bonding wire 162 may be in contact with the substrate pad 103. Thus, the second semiconductor chip 130 may be electrically connected to the circuit substrate 102 via the interposer 320. Unlike the first and second embodiments, the semiconductor package 300 according to the present embodiment may not comprise the fourth bonding wire (see 164 of FIG. 1C) which directly connects the second semiconductor chip 130 to the circuit substrate 102.

Figure 4A:
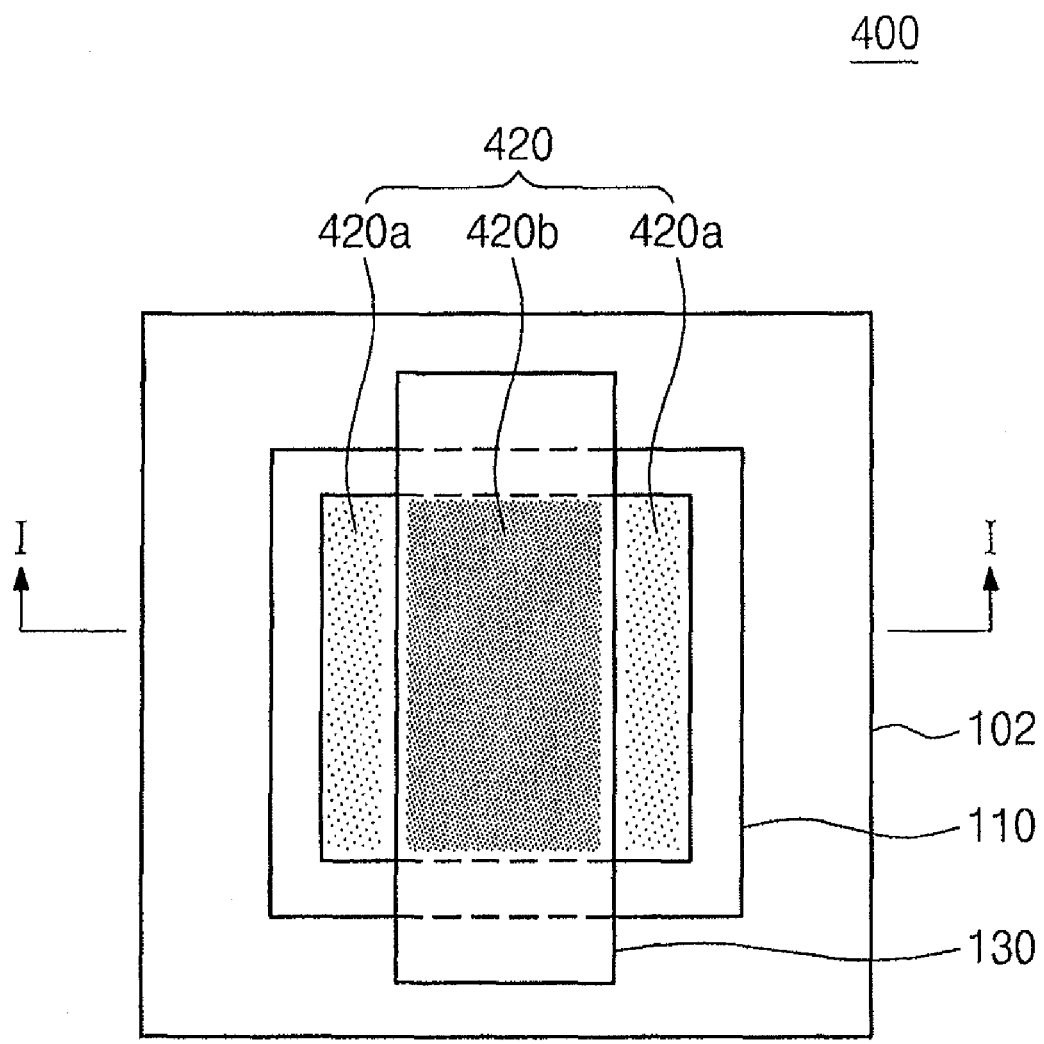
FIG. 4A is a plan view illustrating a fourth exemplary embodiment of a semiconductor package according to aspects of the present invention.
Figure 4B:
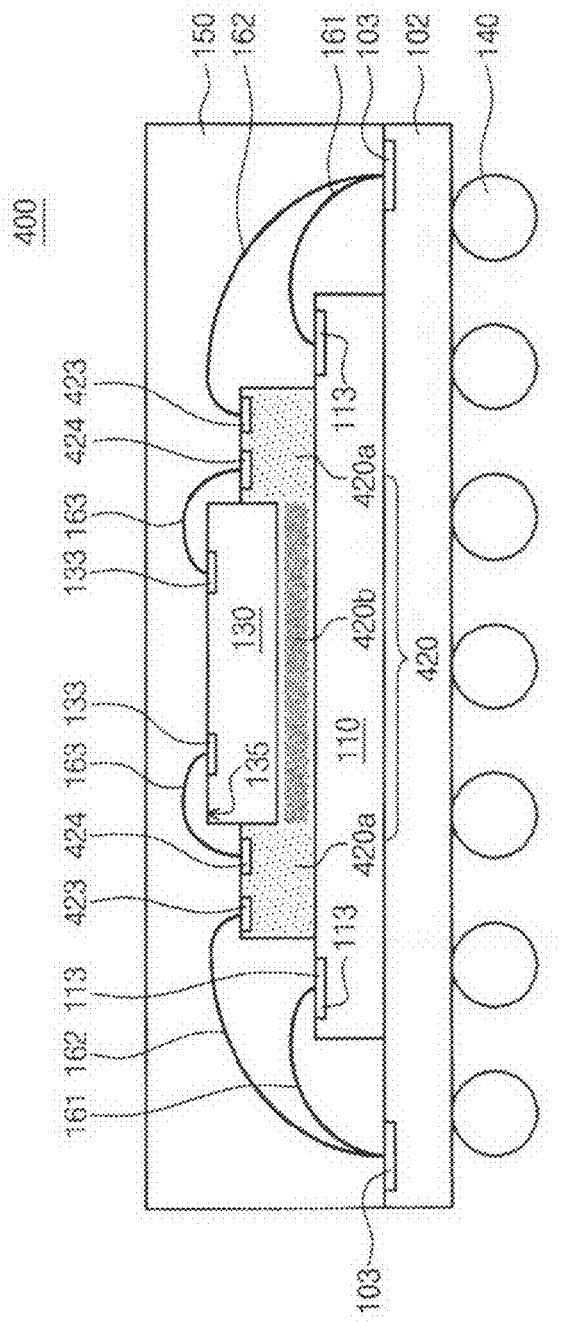
FIG. 4B is a sectional view taken along the line I-I of FIG. 4A.
Figure 4C:
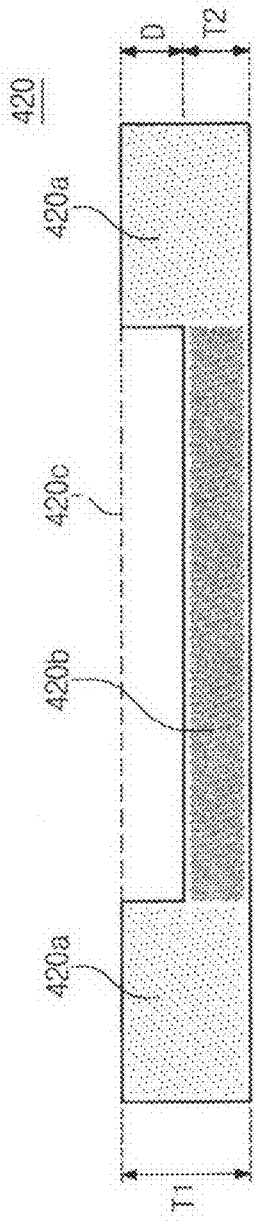
FIG. 4C is a sectional view illustrating a portion of FIG. 4B.

FIG. 4A is a plan view illustrating a fourth embodiment of a semiconductor package 400 according to aspects of the present invention, FIG. 4B is a cross sectional view taken along the line I-I of FIG. 4A, and FIG. 4C is a cross sectional view illustrating a portion of FIG. 4B. The present embodiment is also different from the first embodiment described with reference to FIGS. 1A to 1C in terms of a configuration of a recessed region in which the second semiconductor chip is located. Thus, only the descriptions regarding the recessed region will be developed in detail hereinafter, and the descriptions regarding the same components as the first embodiment will be omitted or briefly mentioned.

Referring to FIGS. 4A through 4C, the semiconductor package 400 according to the third example embodiment may comprise an interposer 420. The interposer 420 may be configured to have at least one recessed region 420c in the upper portion thereof. Thus, the interposer 420 may also have a non-planar top surface, as illustrated in FIGS. 4B and 4C. That is, the top surface of the interposer 420 may have a stepped profile due to the recessed region 420c.

The recessed region 420c may laterally cross a portion of the interposer 420 to define two separated first regions 420a having a first thickness T1 and a second region 420b having a second thickness T2. The second region 420b is defined under the recessed region 420c, and the first regions 420a are disposed at both sides of the second region 420b, as illustrated in FIGS. 4A to 4C. The recessed region 420c may have a depth (or a step height) D which corresponds to a difference between the first thickness T1 and the second thickness T2. In one embodiment, the first regions 420a have electrical circuit patterns therein and the second region 420b does not have any electrical circuit patterns. Thus, the first regions 420a may be referred to as "pattern regions" and the second region 420b may be referred to as "a non-pattern region".

The second semiconductor chip 130 may be stacked on the bottom surface of the recessed region 20c (i.e., on the top surface of the non-pattern region 420b), and the interposer 420 may have pads 423 and 424 in the pattern region 420a. In one embodiment, the second semiconductor chip 130 does not extend onto the top surface of the pattern region 420a, as illustrated in FIG. 4B. One end of the third bonding wire 163 may be in contact with the pad 424 adjacent to the second semiconductor chip 130 and the other end of the third bonding wire 163 may be in contact with the chip pad 133. Further, one end of the second bonding wire 162 may be in contact with the pad 423 adjacent to an edge of the interposer 420, and the other end of the second bonding wire 162 may be in contact with the substrate pad 103. Thus, the second semiconductor chip 130 may be electrically connected to the circuit substrate 102 via the interposer 420. Unlike the first and second embodiments, the semiconductor package 400 according to the present embodiment may not comprise the fourth bonding wire (see 164 of FIG. 1C) which directly connects the second semiconductor chip 130 to the circuit substrate 102.

Figure 5A:
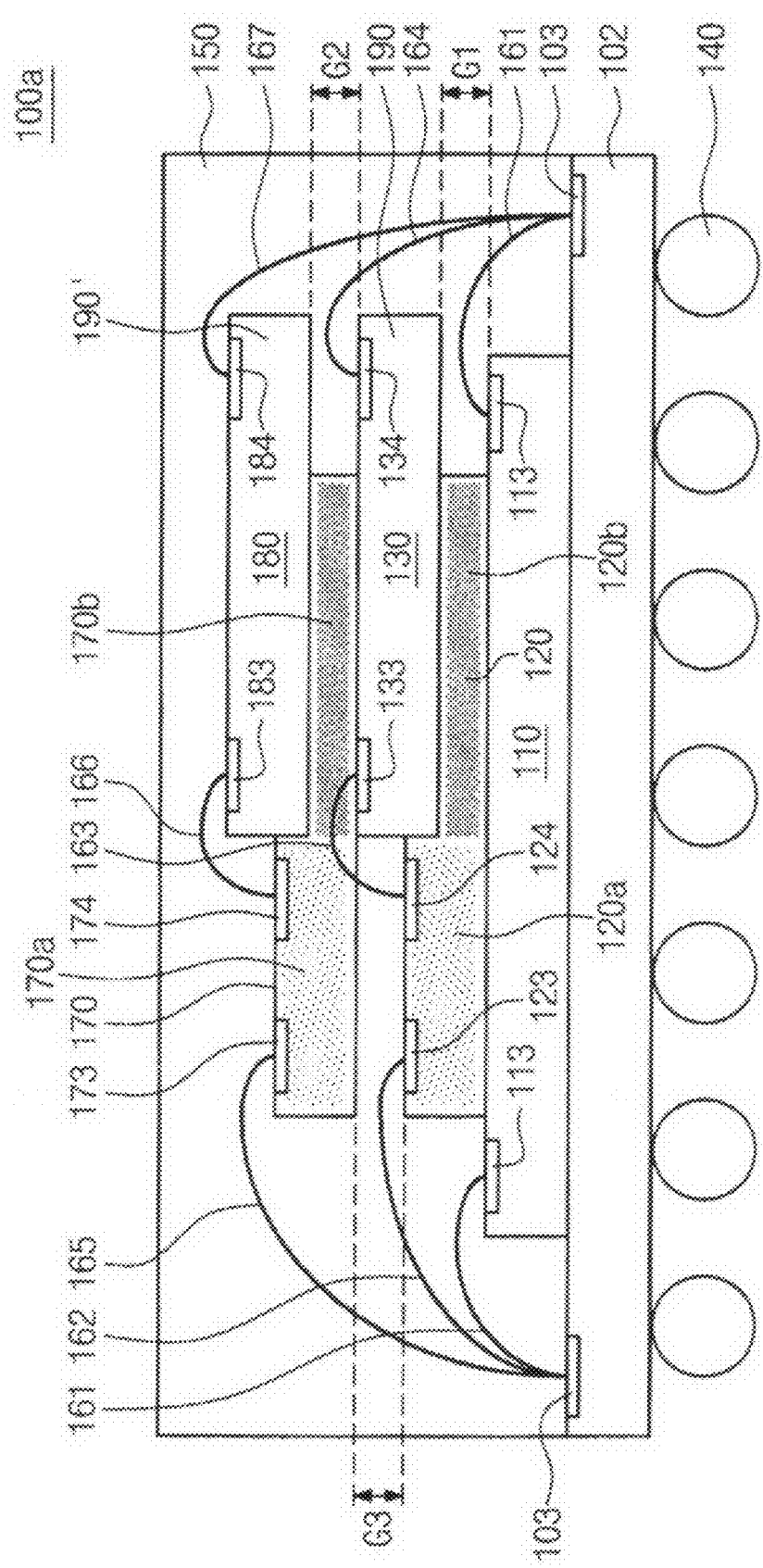
FIG. 5A is a sectional view illustrating a fifth exemplary embodiment of a semiconductor package according to aspects of the present invention.

FIG. 5A is a fifth embodiment of a semiconductor package 100a according to aspects of the present invention.

Referring to FIG. 5A, the semiconductor package 100a may further comprise a second interposer 170 and a third semiconductor chip 180 in addition to the interposer 120 and the second semiconductor chip 130 of the semiconductor package 100 illustrated in FIGS. 1A to 1C. The second interposer 170 may be disposed on the second semiconductor chip 130 and the third semiconductor chip 180 may be disposed on the second interposer 170. The shape or the configuration of the second interposer 170 may be identical or similar to that of the interposer 120, as depicted in FIG. 5A. That is, the second interposer 170 may have a first region 170a and a second region 170b which is thinner than the first region 170a. Further, the third semiconductor chip 180 may be stacked on the second interposer 170 using the same manner as the first embodiment described with reference to FIGS. 1A to 1C. That is, the third semiconductor chip 180 may be stacked on the second region 170b of the second interposer 170.

The second interposer 170 may be electrically connected to the circuit substrate 102 through a fifth boding wire 165. One end of the fifth bonding wire 165 may contact a pad 173 adjacent to an edge of the second interposer 170, and the other end of the fifth bonding wire 165 may contact the substrate pad 103. The third semiconductor chip 180 may be electrically connected to the second interposer 170 through a sixth bonding wire 166. One end of the sixth bonding wire 166 may contact a pad 174 adjacent to the third semiconductor chip 180, and the other end of the sixth bonding wire 166 may contact a chip pad 183 adjacent to an edge of the third semiconductor chip 180. Thus, the third semiconductor chip 180 may be electrically connected to the circuit substrate 103 via the second interposer 170. In addition, the third semiconductor chip 180 may be directly connected to the circuit substrate 102 via a seventh bonding wire 167. One end of the seventh bonding wire 167 may contact a chip pad 184 which is located opposite the chip pad 183, and the other end of the seventh bonding wire 167 may contact the substrate pad 103.

As mentioned above, there may be the first gap space G1 between the overhang 190 of the second semiconductor chip 130 and the first semiconductor chip 110. Similarly, there may be a second gap space G2 between an overhang 190' of the third semiconductor chip 180 and the overhang 190 of the second semiconductor chip 130. The second gap space G2 provides a sufficient space to prevent the fourth bonding wire 164 from being in contact with a backside surface of the third semiconductor chip 180. Moreover, there may be a third gap space G3 between the first region 120a of the first interposer 120 and the first region 170a of the second interposer 170. The third gap space G3 may also provide a sufficient space to prevent the second bonding wire 162 from being in contact with a backside surface of the second interposer 170. These gap spaces G1 to G3 may increase the bonding margins. The other elements and their structural relationships are similar to those described in the first embodiment with reference to FIGS. 1A through 1C.

Alternatively, even though not shown in the drawings, the semiconductor package 100a of the fifth embodiment may be modified in various different forms, as would be appreciated by those skilled in the art having the benefit of this disclosure. For example, the semiconductor package 100a may comprise the semiconductor package 300 of the second embodiment as depicted in FIG. 2A through 2C, as well as the second interposer 170 stacked on the second semiconductor chip 130 and the third semiconductor chip 180 stacked on the second interposer 170. In this case, the second interposer 170 may include a recessed region which has the same configuration as the recessed region 220c of the first interposer 220, and the third semiconductor chip 180 may be stacked on the bottom surface of the recessed region in the second interposer 170.

Figure 5B:
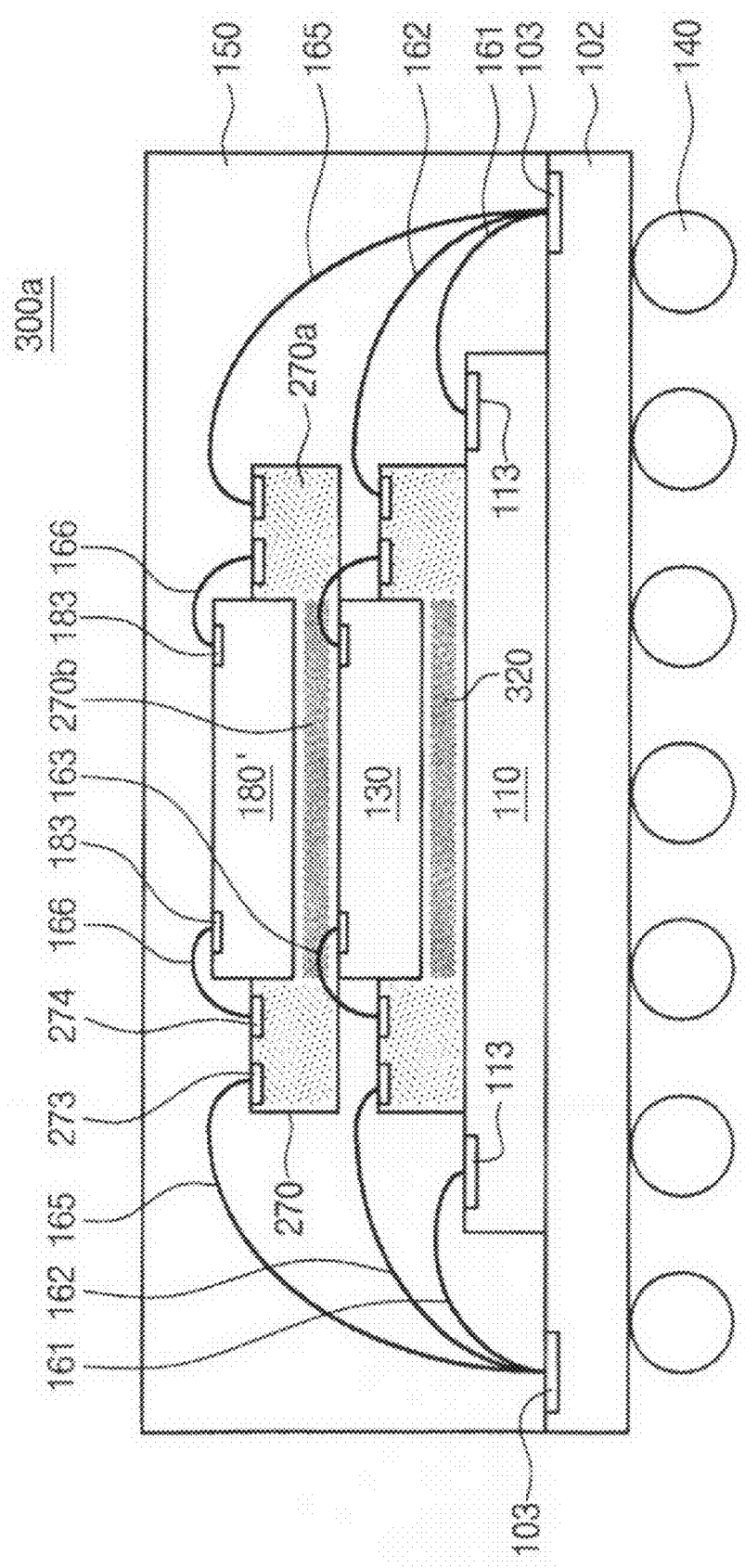
FIG. 5B is a sectional view illustrating a sixth exemplary embodiment of a semiconductor package according to aspects of the present invention.

FIG. 5B is a cross sectional view illustrating a sixth embodiment of a semiconductor package 300a according to aspects of the present invention.

Referring to FIG. 5B, the semiconductor package 300a may further comprise a second interposer 270 and a third semiconductor chip 180' in addition to the interposer 320 and the second semiconductor chip 130 of the semiconductor package 300 illustrated in FIGS. 3A to 3C. The second interposer 270 may be disposed on the second semiconductor chip 130 and the third semiconductor chip 180' may be disposed on the second interposer 270. The shape or the configuration of the second interposer 270 may be identical or similar to that of the interposer 320, as depicted in FIG. 5B. That is, the second interposer 270 may have a first region 270a and a second region 270b which is thinner than the first region 270a, and the second region 270b may be surrounded by the first region 270a. Further, the third semiconductor chip 180' may be stacked on the second interposer 270 in the same manner as the third embodiment described with reference to FIGS. 3A to 3C. That is, the third semiconductor chip 180' may be stacked on the second region 270b of the second interposer 270.

The second interposer 270 may be electrically connected to the circuit substrate 102 through a fifth boding wire 165. One end of the fifth bonding wire 165 may contact a pad 273 adjacent to an edge of the second interposer 270, and the other end of the fifth bonding wire 165 may contact the substrate pad 103. The third semiconductor chip 180' may be electrically connected to the second interposer 270 through a sixth bonding wire 166. One end of the sixth bonding wire 166 may contact a pad 274 adjacent to the third semiconductor chip 180', and the other end of the sixth bonding wire 166 may contact a chip pad 183 adjacent to an edge of the third semiconductor chip 180'. Thus, the third semiconductor chip 180' may be electrically connected to the circuit substrate 103 via the second interposer 270. The semiconductor package 300a according to the present embodiment may not comprise the fourth bonding wire (see 164 of FIG. 1C) that directly connects the second semiconductor chip 130 to the circuit substrate 102.

Figure 5C:
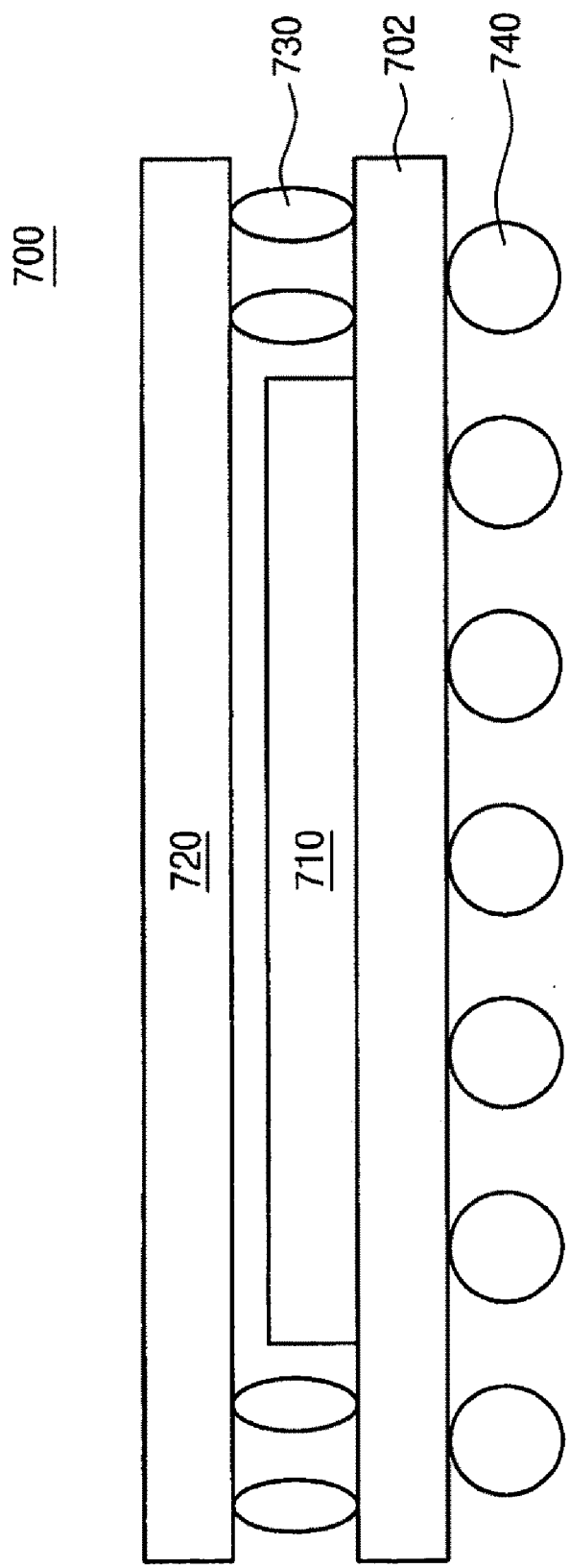
FIG. 5C is a sectional view illustrating a seventh exemplary embodiment of a semiconductor package according to aspects of the present invention.

FIG. 5C is a cross sectional view illustrating a seventh embodiment of a semiconductor package 700 according to aspects of the present invention.

Referring to FIG. 5C, the semiconductor package 700 may comprise a circuit substrate 702, a first semiconductor package 710 stacked on the circuit substrate 702 and a second semiconductor package 720 stacked on the first semiconductor package 710. The first and second semiconductor packages 710 and 720 may be electrically connected to each other through electrical interconnection members 730, such as solder balls, solder bumps, etc. The circuit substrate 702 may comprise a printed circuit board. The circuit substrate 702 may include a plurality of external interconnection terminals 740, such as solder balls, which are formed on a backside surface thereof.

The first semiconductor package 710 may be one of the semiconductor packages 100 through 400 described in the first through fourth exemplary embodiments. Alternatively, the first semiconductor package 710 may be one of the semiconductor packages 100a and 300a described in the fifth and sixth exemplary embodiments. The second semiconductor package 720 may also be one of the semiconductor packages 100, 200, 300, 400, 100a and 300a described in the first to sixth embodiments. At least one of the first and second semiconductor packages 710 and 720 may be encapsulated using a molding material, such as an epoxy molding compound material.

Figure 6A:
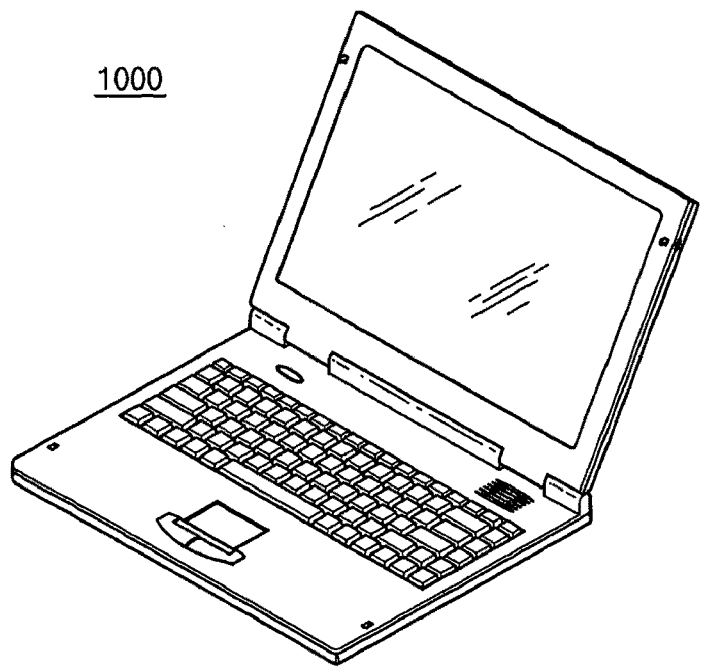
FIG. 6A is a perspective view illustrating an embodiment of an electronic product comprising a semiconductor package according to one of the aspects of the present invention.
Figure 6B:
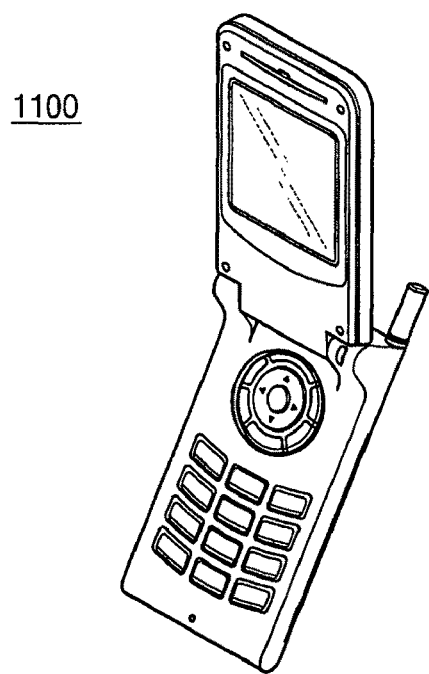
FIG. 6B is a perspective view illustrating another embodiment of an electronic product comprising a semiconductor package according to one of the aspects of the present invention.

FIGS. 6A and 6B are perspective views illustrating embodiments of electronic products employing semiconductor packages according to aspects of the present invention.

Referring to FIGS. 6A and 6B, the semiconductor packages of the first to seventh exemplary embodiments may be employed in electronic products such as a laptop computer 1000, a mobile phone 1100, a personal digital assistant, etc. Additionally or alternatively, the electronic products may comprise a desktop computer, a camcorder, a camera, a game player, a portable multimedia player, an MP3 player, a portable global position system device, a memory card, a display unit such as a liquid crystal display or a plasma display panel, or the like.

Although embodiments in accordance with the present invention have been described and illustrated in the accompanying drawings, the present invention is not limited thereto. It will be apparent to those skilled in the art that various substitution, modifications and changes may be thereto without departing from the scope and spirit of the invention. The scope of the present invention is defined by the claims, and structural and functional equivalents thereof.

What is claimed is:

1. A semiconductor package comprising:
   a substrate;
   first and second semiconductor chips stacked on the substrate; and
   a first interposer between the first and second semiconductor chips, the first interposer having a first non-planar top surface,
   wherein the first non-planar top surface comprises a stepped region defining a first region and a second region, wherein the second region is thinner than the first region to define a recessed region on the second region, and wherein the second region is disposed only at one side of the first region; and
   wherein the first interposer has a rectangular shape including four corners, the second region is disposed to include only one corner of the first interposer, and the first region is disposed to include three corners of the first interposer.

2. The semiconductor package of claim 1, wherein the second semiconductor chip is stacked on the second region.

3. The semiconductor package of claim 1, wherein the first interposer comprises a circuit pattern disposed in one of the first and second regions.

4. The semiconductor package of claim 1, wherein the second semiconductor chip vertically protrudes from a top surface of the first region.

5. The semiconductor package of claim 1, wherein the second semiconductor chip laterally extends to have an overhang the first semiconductor chip.

6. The semiconductor package of claim 5, further comprising a gap between the first semiconductor chip and the overhang of the second semiconductor chip, wherein the gap has a vertical width substantially equal to a thickness of the second region of the first interposer.

7. The semiconductor package of claim 6, further comprising a bonding wire electrically connecting the substrate to the first semiconductor chip, wherein the bonding wire is disposed in the gap.

8. The semiconductor package of claim 1, wherein the first semiconductor chip is electrically and directly connected to the substrate, wherein the first interposer is electrically and directly connected to the substrate, and wherein the second semiconductor is electrically connected to the substrate through the first interposer.

9. The semiconductor package of claim 8, wherein the second semiconductor chip is also electrically and directly connected to the substrate.

10. The semiconductor package of claim 1, further comprising:
   a third semiconductor chip stacked on the second semiconductor chip; and
   a second interposer disposed between the second semiconductor chip and the third semiconductor chip to electrically connect the third semiconductor chip to the substrate, the second interposer having a second non-planar top surface.

11. A semiconductor package comprising:
   a first semiconductor package including a first semiconductor chip, a second semiconductor chip and a first interposer between the first and second semiconductor chips, the first interposer having a first non-planar top surface; and
   a second semiconductor package stacked on the first semiconductor package, the second semiconductor package including a third semiconductor chip, a fourth semiconductor chip and a second interposer between the third and fourth semiconductor chips, the second interposer having a second non-planar top surface,
   wherein at least one of the first and second non-planar top surfaces comprises a stepped region defining a first region and a second region, wherein the second region is thinner than the first region to define a recessed region on the second region, and wherein the second region is disposed only at one side of the first region; and
   wherein at least one of the first and second interposers has a rectangular shape including four corners, the second region is disposed to include only one corner of the at least one of the first and second interposers, and the first region is disposed to include three corners of the at least one of the first and second interposers.

12. A method of manufacturing a semiconductor package, the method comprising:
   providing a substrate;
   mounting a first semiconductor chip on the substrate to electrically connect the first semiconductor chip to the substrate;
   mounting a first interposer on the first semiconductor chip to electrically connect the first interposer to the substrate, wherein the first interposer comprises a stepped region defining a first region and a second region, wherein the second region is thinner than the first region to define a recessed region on the second region, wherein the second region is disposed only at one side of the first region, and wherein the first interposer has a rectangular shape including four corners, the second region is disposed to include only one corner of the first interposer, and the first region is disposed to include three corners of the first interposer; and
   mounting a second semiconductor chip on the second region of the first interposer to electrically connect the second semiconductor chip to the first interposer.

13. The method of claim 12, wherein mounting the second semiconductor chip comprises electrically connecting the second semiconductor chip to the substrate through the first interposer.

14. The method of claim 13, wherein mounting the second semiconductor chip further comprises electrically and directly connecting the second semiconductor chip to the substrate.

15. The method of claim 12, further comprising:
   mounting a second interposer on the second semiconductor chip to electrically connect the second interposer to the substrate, wherein the second interposer comprises a first region and a second region which is lower than the first region; and
   mounting a third semiconductor chip on the second region of the second interposer to electrically connect the third semiconductor chip to the second interposer.

* * * * *